United States Patent
Guist

(10) Patent No.: US 8,229,714 B2
(45) Date of Patent: Jul. 24, 2012

(54) METHOD FOR SIMULATING A PHYSICAL PROPERTY OF A TECHNICAL STRUCTURE BY A COMPONENT MODEL

(75) Inventor: Christian Guist, Markt Schwaben (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 371 days.

(21) Appl. No.: 12/560,101

(22) Filed: Sep. 15, 2009

(65) Prior Publication Data

US 2010/0004912 A1 Jan. 7, 2010

Related U.S. Application Data

(63) Continuation of application No. PCT/EP2008/001606, filed on Feb. 29, 2008.

(30) Foreign Application Priority Data

Mar. 16, 2007 (DE) .......................... 10 2007 012 634

(51) Int. Cl.
*G06F 17/50* (2006.01)
*G06T 17/00* (2006.01)
(52) U.S. Cl. ........................................ 703/1; 345/428
(58) Field of Classification Search .................. 703/1, 2; 345/428
See application file for complete search history.

(56) References Cited

U.S. PATENT DOCUMENTS

| | | | |
|---|---|---|---|
| 6,044,210 A | 3/2000 | Nagtegaal | |
| 7,071,936 B2* | 7/2006 | Hoppe et al. | 345/420 |
| 7,146,859 B2 | 12/2006 | Dittmann et al. | |
| 7,425,954 B2* | 9/2008 | Hoppe et al. | 345/420 |
| 7,707,525 B2* | 4/2010 | Varon-Weinryb | 716/136 |
| 2003/0229476 A1 | 12/2003 | Naganarayana et al. | |
| 2008/0221845 A1* | 9/2008 | Yu et al. | 703/2 |

FOREIGN PATENT DOCUMENTS

| | | |
|---|---|---|
| DE | 102 22 699 A1 | 12/2003 |
| DE | 103 26 228 A1 | 12/2004 |
| DE | 103 60 150 A1 | 7/2005 |
| DE | 10 2004 046 912 A1 | 3/2006 |

OTHER PUBLICATIONS

A.N. Bercin, "Eigenfrequencies of Rectangular Plate Assemblies", 1997, Computer & Structures, vol. 65, No. 5, pp. 703-711.*
German Search Report dated Jan. 21, 2008 including partial English translation (Nine (9) pages).
J. Neumann et al., "Computation of single eigenfrequencies and elgenfunctions of plate and shell structures using an h-adaptive FE-method", Computational Mechanics, vol. 40, No. 1, Jun. 21, 2006, pp. 111-126, XP019518280.
International Search Report dated Jul. 17, 2008 w/English translation (two (2) pages).

* cited by examiner

*Primary Examiner* — Kamini S Shah
*Assistant Examiner* — Juan Ochoa
(74) *Attorney, Agent, or Firm* — Crowell & Moring LLP

(57) ABSTRACT

A method for simulating a physical property of a component model comprising a computer accessible construction model of a technical structure, by automatically generating a mesh of a component model. The component model is first described by a fine mesh of finite elements, and, based on the fine mesh, a fine natural frequency of the component model is determined. The component model is then described by a coarse mesh of finite elements, and based on the coarse mesh, a coarse natural frequency of the component model is determined. In this context, for example, the deviation of the coarse natural frequency from the fine natural frequency is used as a measure for the quality of the coarse mesh.

6 Claims, 1 Drawing Sheet

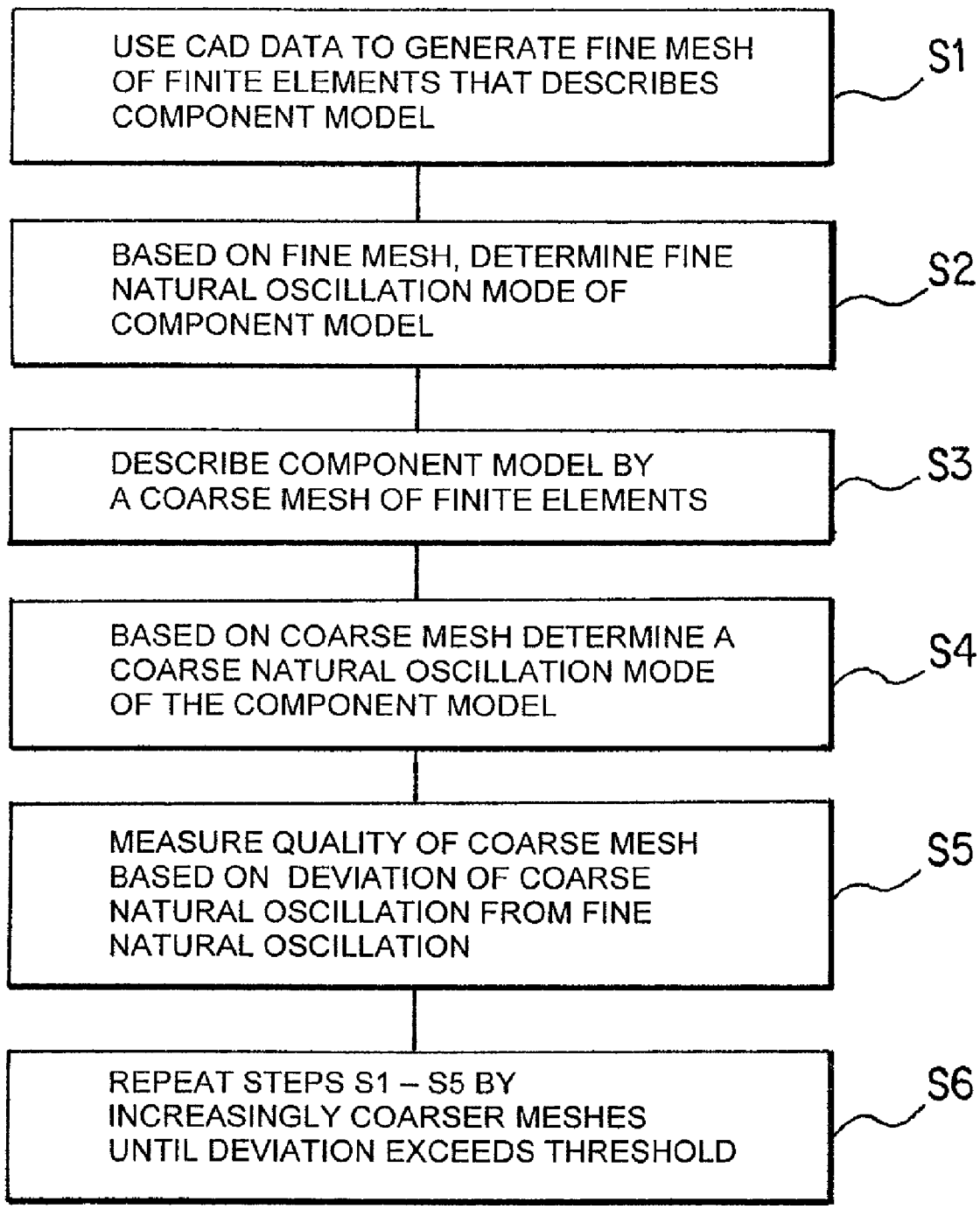

METHOD FOR SIMULATING A PHYSICAL PROPERTY OF A TECHNICAL STRUCTURE BY A COMPONENT MODEL

CROSS-REFERENCE TO RELATED APPLICATIONS

This application is a continuation of PCT International Application No. PCT/EP2008/001606, filed Feb. 29, 2008, which claims priority under 35 U.S.C. §119 to German Patent Application No. DE 10 2007 012 634.6, filed Mar. 16, 2007, the entire disclosures of which are herein expressly incorporated by reference.

This application contains subject matter related to U.S. application Ser. No. 12/559,917, entitled "Method for Simulating a Physical Property of a Technical Structure by a Component Model," filed on even date herewith.

BACKGROUND AND SUMMARY OF THE INVENTION

The invention relates to a method and a system for simulating a physical property of a technical structure, such as motor or a motor part, by automatically generating a mesh of a component model, based on finite elements, and to a corresponding computer program product.

The finite element method (FEM) is a widespread computation method in engineering. In the finite element method, a computational domain is divided into a large number of small, but many, finite elements. On the basis of these elements trial functions are usually defined that produce a large system of equations by way of a partial differential equation and the boundary conditions. Then the sought for results are derived from the solved system of equations.

German patent document DE 10360150 A1 discloses a method for generating the envelope of a body based on a predetermined mesh of a construction model in order to reproduce physical events on the surface of a technical system through a finite element simulation.

German patent document DE 10326228 A1, on the other hand, discloses a method for accelerating the meshing for finite element simulations of a system with multiple bodies; and U.S. Pat. No. 6,044,210 discloses a method for determining a finite element model for a structural element.

With standard software for finite element simulations, like ABAQUS, it is already possible to automatically mesh a component model (that is, to describe it by means of a plurality of finite elements). In particular, it is already possible with this standard software to adapt FE (finite element) networks to an example of application. For example, ABAQUS provides a so-called "adaptive remeshing," which describes in a first step a component model by means of a coarse FE network (synonymous with "coarse mesh of finite elements" or "coarse mesh with finite elements"). Then this network is automatically refined in an area where high mechanical stresses occur, in order to describe in a more suitable manner the component model for additional calculations. The automatic refinement is triggered as a function of the stress gradients between two FE elements. In this procedure the stress gradient between the FE elements is determined, and if it exceeds a certain value, then the network is refined at this point. As a result of the finer resolution, the stress gradient decreases.

This procedure is executed in an iterative manner until the stress gradients satisfy the established criteria. The finer the mesh, the better the mesh can usually describe the component model, the more memory space said model usually requires, and the more computationally intensive the additional calculations or simulations, which are based on this mesh, usually are.

One object of the present invention is to provide a method for simulating a physical property of a technical structure by automatically generating a mesh of a component model, which requires little memory space and yet suitably describes (that is, closely accords with reality) the component model. In this context, the component model may be, for example, a computer accessible construction model of any technical system or any technical structure, like a motor or a motor element or a part of a motor element.

This and other objects and advantages are achieved by the method and apparatus according to the invention, which departs from the prior art technique of proceeding from a coarse mesh, in a step-by-step manner, to a finer mesh. Instead, the technique of the present invention is precisely the reverse: to describe the component model initially by means of a fine mesh, and then taking this fine mesh as a basis, to pass, in particular, step by step, at least area by area, to a coarser mesh.

This strategy has the advantage that a decision about which area of a component model ought to be finely meshed and which area ought to be coarsely meshed is based on a fine mesh, so that it is more reliable or leads more directly to the target than in the prior art. This approach results in a more adaptive mesh of a component model than in the prior art. Yet it can also make do with little memory space, especially because of the specifically selected areas of the coarse mesh. An additional advantage lies in the fact that an automatic mesh is quite possible, especially if the element size is small.

BRIEF DESCRIPTION OF THE DRAWING

The single FIGURE is a flow chart that illustrates the steps performed by the simulation method according to the invention.

DETAILED DESCRIPTION OF THE DRAWING

As shown in the FIGURE, for automatically generating a mesh of a predetermined component model (which is described, for example, by means of CAD data), a preferred embodiment provides that the component model is described automatically, by means of a fine mesh of finite elements (or with finite elements) (Step S1), and based on the fine mesh, at least one fine natural oscillation of the component model (that is, a specific, fine mesh-based natural oscillation of the component model) is determined automatically (Step S2): in particular, a fine natural frequency (the fine mesh-based natural frequency of the component model of a specific natural oscillation) and/or a fine natural oscillation mode (the fine mesh-based natural oscillation mode of the component model of a specific natural oscillation) is determined.

Then the component model is described automatically, at least area by area by means of a coarse mesh of finite elements (Step S3), and based on the coarse mesh at least one coarse natural oscillation of the component model (that is, a specific, coarse mesh-based natural oscillation of the component model of the component model) is determined automatically (Step S4): in particular, a coarse natural frequency (the coarse mesh-based natural frequency of the component model of a specific natural oscillation) and/or a coarse natural oscillation mode (the coarse mesh-based natural oscillation mode of the component model of a specific natural oscillation), of the component model is determined.

Thereafter, the deviation of the coarse natural frequency from the fine natural frequency and/or the deviation of the coarse natural oscillation mode from the fine natural oscillation mode is (are) used, in particular automatically, as a measure for the quality of conformance, quality or adaptiveness of the coarse mesh and, for example, is displayed (Step S5).

Therefore, according to the invention, the component model is initially described suitably, but memory-intensively, by the fine mesh, and, in so doing, the fine natural frequency (which is based thereon) is accurately determined. Then the component model is described, at least area by area, by a coarse mesh with a low memory space requirement, so that the coarse natural frequency, which is based thereon, is accurately determined. Whether this coarse mesh describes the component model in a manner that is still suitable can then be determined based on the deviation of the coarse natural frequency from the fine natural frequency. The smaller the deviation, the more adaptive (or realistic) is the description of the component model, based on the coarse mesh.

In the coarse mesh (or the coarser mesh) of the component model, the average volume or the average edge length of the finite elements, used for the mesh, in at least one area of the component model or in the whole component model, is larger than in the fine mesh.

The automatic description of the component model by a fine and/or coarse or coarser mesh is known, for example, from the standard software ABAQUS and, thus, can be executed. This also applies to the determination of a natural frequency or a natural oscillation mode of the natural oscillation, based on a mesh that has been automatically generated beforehand.

Within the scope of the invention, however, it is found that a plurality of natural oscillations, in particular natural frequencies, can be determined on the basis of the different meshes and that the corresponding deviations can be used as a criterion for the quality of conformance.

An especially preferred embodiment of the invention provides that, proceeding on the basis of a fine mesh, the component model is described, automatically, step by step, area by area, by increasingly coarser meshes, especially until the deviation of the coarse natural frequency from the fine natural frequency exceeds a predetermined or user-set threshold value (Step S6). Then the deviation of the coarse natural frequency from the fine natural frequency can be used, in particular automatically, as the criterion for an abortive end of an automated mesh of a component model. Thus, proceeding on the basis of a fine mesh, the component model is described automatically step by step by an increasingly coarser mesh in at least certain areas.

A further embodiment of the invention is based on the idea of pinpointing suitable areas of the component mode for a description by means of a coarser mesh, by analyzing the deformation behavior of the finite elements. Then (preferably in addition), based on the fine mesh, the natural oscillation behavior of the component model is determined, automatically, especially in a predetermined frequency range of, for example, 100 hertz to 3,000 hertz. Based on the natural oscillation behavior, at least one area of the component model is determined, automatically, its finite elements being less deformed (or deformed in a weaker manner) than the finite elements of another area of the component model. (In particular, the finite elements are assigned by computation a weaker deformation). The determined area is then described, automatically by a coarser mesh of finite elements, and is given more preference than before, and/or than the other area of the component model.

As a result, based on a fine mesh, the natural oscillation behavior of the component model and/or the deformation behavior of its finite elements can be determined reliably and accurately; and based on this accurate and reliable result, the areas that are less deformed can be described selectively and accurately by a coarser mesh. The targeted coarser mesh of these areas has less of a negative influence on the quality of conformance, the adaptiveness, or the quality of the whole mesh of the component model, than the coarser mesh of the areas, in which the finite elements are highly deformed, or than the arbitrary coarser mesh of the component model.

As a result, the mesh of the component model can be mapped in a more memory-efficient manner, and can be further processed efficiently, while at the same time it can still be described sufficiently adaptively that the simulations, which are based on the mesh of the component model, will lead to acceptably accurate results.

The determination of the deformation of finite elements is known, for example, from the standard software ABAQUS. For example, a finite element is more highly deformed than another i) if the distances between the nodes, which belong to this finite element, change more readily, based on the calculation, than the distances between other finite elements, or ii) if the difference between the maximum volume and the minimum volume during the period of the longest natural oscillation is greater than the corresponding difference of the other finite element.

As an alternative or in addition to the deformation of the finite elements, a size that correlates to the deformation can also be used as a criterion for the next phase of coarsening the mesh. For example, based on the natural oscillation behavior, at least one area of the component model can be determined and can be described by a coarser mesh, in that its associated finite elements are assigned, in particular by computation, less elongation, less stress, a smaller elongation gradient, a smaller stress gradient, a smaller edge length change, a smaller node displacement or a smaller volume change than the finite elements in another area.

As an alternative or in addition to the above, based on the fine mesh, the natural oscillation behavior of the component model is determined, in particular in a predetermined frequency range, and based on the natural oscillation behavior, at least one area of the component model is determined, whose finite elements are more severely deformed than the finite elements of another area of the component model. The former area of the component model is then described by an even finer mesh of finite elements or an even finer mesh with finite elements.

The natural oscillation behavior of the component model is based preferably on an overlapping of several (that is, from two up to all) natural oscillations that lie in a predetermined frequency range. Hence, in particular, the deformation behavior of the finite elements is considered for the case that the component model oscillates with an overlapping of several or all natural oscillations that lie in a predetermined frequency range.

The scope of the invention also includes a system for automatically generating a mesh of a component model with a computer that is set up in such a manner that a described method is carried out.

The scope of the invention also includes a computer program product for automatically generating a mesh of a component model. The computer program product comprises a computer readable storage medium, on which a program is stored that enables a data processing system to carry out a described method after said program has been loaded into a memory of a data processing system.

The invention is described in detail below with reference to one example.

The invention proposes a new method that is suited to the acoustics calculation, for example. The acoustics calculation requires FE models that readily map the natural oscillation behavior of the modeled component. This mapping is supposed to be achieved with the maximum number of element sizes. The drawback of small element sizes is the plurality of elements and the related high memory space requirement of the models as well as the long computing times. For the acoustics calculation the usual approach is to construct complete motor-transmission groups that consist of a very large number of components.

The proposed method takes as a basis a fine FE network (fine mesh). This method is used to map the natural oscillation behavior as well as possible. The FE network serves as the basis and reference for additional calculations. For this model (described by the fine mesh), the natural oscillation behavior is calculated in a predetermined frequency range.

Each oscillation mode that occurs in this area generates a cyclically variable deformation in the FE model (=FE network). As a result, certain areas exhibit high elongation, other areas exhibit only low elongation. In the areas with the high elongation it is important to map the stiffness correctly, using fine FE elements (small element sizes, fine mesh). The areas of low elongation, on the other hand, can be modeled in a coarser manner. If the model is supposed to deliver good results for a frequency range, the deformation of all modes that occur in this frequency range can be overlapped. Then the method, which is described below, is applied to the model with the corresponding total deformation.

The proposed method is intended to adapt the FE element size to the elongation. In this case the principle is to retain (or even to refine) a fine network in areas of high elongation, and to coarsen the FE network (mesh) in areas of low elongation. The formulaic relationship between the elongation and the FE element size can be selected by the user in a manner which is known to those skilled in the art.

A new calculation is performed with the network that has been modified in this manner. The results are compared with the preceding calculation with respect to the natural frequency and the natural mode (for example, tested on excursions of selected points). If the deviation of the coarsened network is below a limit to be specified, then the coarsening operation continues, according to the aforementioned method; otherwise the method is aborted, and the last valid calculation is used.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for simulating a physical property of a component model comprising a computer accessible construction model of a technical structure, by automatically generating a mesh of the component model, said method comprising:
   using CAD data to describe the component model by means of a fine mesh of finite elements;
   based on the fine mesh, determining at least one fine natural oscillation of the component model, comprising at least one of a fine natural frequency and a fine natural oscillation mode;
   describing the component model by means of a coarse mesh of finite elements;
   based on the coarse mesh, determining at least one coarse natural oscillation of the component model, comprising at least one of a coarse natural frequency and a coarse natural oscillation mode;
   as a measure for the quality of the coarse mesh, using a deviation of the coarse natural oscillation, comprising at least one of the coarse natural frequency and the coarse natural oscillation mode, from the fine natural oscillation, the fine natural frequency and the fine natural oscillation mode;
   describing the component model iteratively by increasingly coarser meshes, beginning from the fine mesh, until the deviation of a current coarse natural oscillation from the fine natural oscillation exceeds a threshold value; and
   automatically aborting said generating of the mesh of the component model when the threshold value is exceeded, wherein the increasingly coarser mesh which is used to describe the component model at the point when the threshold value is exceeded is used for said simulating the physical property of the component model.

2. The method as claimed in claim 1, wherein:
   based on the fine mesh, a natural oscillation behavior of the component model is determined;
   based on the natural oscillation behavior, at least one area of the component model, the finite elements of which are less deformed than the finite elements of another area of the component model, is determined; and
   said at least one area of the component model is described by a coarser mesh of finite elements.

3. The method, as claimed in claim 1, wherein:
   based on the fine mesh, the natural oscillation behavior of the component model is determined;
   based on the natural oscillation behavior, at least one area of the component model is determined, whose finite elements are more highly deformed than finite elements of another area of the component model; and
   the at least one area of the component model is described by means of a finer mesh of finite elements.

4. The method, as claimed in claim 1, wherein the natural oscillation behavior is based on an overlapping of at least two natural oscillations that lie in a predetermined frequency range.

5. A system for simulating a physical property of a component model comprising a computer accessible construction model of a technical structure, by automatically generating a mesh of the component model, said system comprising a computer that is set up in such a manner that:
   the component model is described by means of a fine mesh of finite elements;
   based on the fine mesh, at least one fine natural oscillation of the component model, comprising at least one of a fine natural frequency and a fine natural oscillation mode is determined,
   the component model is described by means of a coarse mesh of finite elements;
   based on the coarse mesh, at least one coarse natural oscillation of the component model comprising at least one of, a coarse natural frequency and a coarse natural oscillation mode, is determined;
   as a measure for the quality of the coarse mesh, the deviation of the coarse natural oscillation comprising at least one of the coarse natural frequency and the coarse natural oscillation mode, from the fine natural oscillation, the fine natural frequency and/or the fine natural oscillation mode, is used;

the component model is iteratively described by increasingly coarser meshes, beginning from the fine mesh, until the deviation of a current coarse natural oscillation from the fine natural oscillation exceeds a threshold value; and the generation of the mesh of the component model is automatically aborted when the threshold value is exceeded, wherein the increasingly coarser mesh which is used to describe the component model at the point when the threshold value is exceeded is used for said simulating the physical property of the component model.

6. A computer program product for simulating a physical property of a technical structure comprising a motor or a motor part, by automatically generating a mesh of a component model, said computer program product comprising non-transitory computer readable storage medium, on which a program is stored that enables a data processing system, after said program has been loaded into a memory of a data processing system, such that:

the component model is described by means of a fine mesh of finite elements;

based on the fine mesh, at least one fine natural oscillation of the component model, comprising at least one of a fine natural frequency and a fine natural oscillation mode is determined, the component model is described by means of a coarse mesh of finite elements;

based on the coarse mesh, at least one coarse natural oscillation of the component model comprising at least one of, a coarse natural frequency and a coarse natural oscillation mode, is determined; and as a measure for the quality of the coarse mesh, the deviation of the coarse natural oscillation comprising at least one of the coarse natural frequency and the coarse natural oscillation mode, from the fine natural oscillation, the fine natural frequency and/or the fine natural oscillation mode, is used the component model is iteratively described by increasingly coarser meshes, beginning from the fine mesh, until the deviation of a current coarse natural oscillation from the fine natural oscillation exceeds a threshold value; and the generation of the mesh of the component model is automatically aborted when the threshold value is exceeded, wherein the increasingly coarser mesh which is used to describe the component model at the point when the threshold value is exceeded is used for said simulating the physical property of the component model.

* * * * *